United States Patent [19]

Stihi

[11] Patent Number: 5,473,208
[45] Date of Patent: Dec. 5, 1995

[54] COOLING STRUCTURE FOR ALTERNATOR RECTIFIER

[76] Inventor: Edward Stihi, 43-41 44th St., Sunnyside, N.Y. 11104

[21] Appl. No.: 255,443

[22] Filed: Jun. 8, 1994

[51] Int. Cl.⁶ .............................. H02K 11/00; H02K 9/02
[52] U.S. Cl. ........................................... 310/68 D; 310/64
[58] Field of Search ....................... 310/64, 68 R, 310/68 D; 363/141; 257/707, 720, 721, 722

[56] References Cited

U.S. PATENT DOCUMENTS

| | | | |
|---|---|---|---|
| 3,198,972 | 8/1965 | Larson | 310/68 D |
| 4,321,664 | 3/1982 | Matthai | 363/141 |
| 4,419,597 | 12/1983 | Shiga et al. | 310/68 D |
| 4,604,538 | 8/1986 | Merrill et al. | 310/68 D |
| 4,606,000 | 8/1986 | Steele et al. | 363/141 |
| 5,043,614 | 8/1991 | Yockey | 310/68 D |
| 5,233,246 | 8/1993 | Yockey | 310/68 D |
| 5,258,673 | 11/1993 | Gotoh | 310/68 D |

*Primary Examiner*—Clayton E. LaBalle
*Attorney, Agent, or Firm*—Terrance L. Siemens

[57] ABSTRACT

Briefly, the invention comprises an improved cooling fin arrangement for a triphasic bridge rectifier used in conjunction with a three phase alternator in an automotive vehicle. The heat transfer ability of a metallic air core heat sink and radiator is more than doubled by increasing its thickness (and thus its exposed surface area) and by providing a cutout groove allowing the air to flow in two directions thus reducing the air flow resistance. An improved cover plate cooperates with the newly provided air flow paths and also provides simplified connectors for the electrical elements.

11 Claims, 7 Drawing Sheets

PRIOR ART.

COOLING STRUCTURE FOR ALTERNATOR RECTIFIER

BACKGROUND OF THE INVENTION

1. Field of the Invention

The present invention relates to improved cooling structure for a triphasic alternator rectifier such as commonly used on automotive vehicles. More specifically, it relates to an improved air cooled heat sink device which provides more surface area and better air flow on such an alternator. More generally it relates to a heat sink device which is well adapted to partially encircle any rotary electromotive machine in close proximity to the rotors of that machine. As such it is particularly well adapted to provide cooling for the control circuitry of any modern motor, generator, or alternator, used in a setting where fluid flow is available for cooling. The cooling fluid may be a gas or liquid or both.

Fields most likely to benefit from the advantages of the instant invention include the transportation, manufacturing, and home appliance industries, as well as any industry dependent on electromotive machinery for power generation. Examples include electric lawn mowers, heating ventilation and air conditioning motors, mixing and blending machinery, and auxiliary power generation on all sorts of vehicles. These are but several examples of possible applications.

Thus it can be seen that the potential fields of use for this invention are myriad and the particular preferred embodiment described herein is in no way meant to limit the use of the invention to the particular field chosen for exposition of the details of the invention.

A comprehensive listing of all the possible fields to which this invention may be applied is limited only by the imagination and is therefore not provided herein. Some of the more obvious applications are mentioned herein in the interest of providing a full and complete disclosure of the unique properties of this previously unknown general purpose article of manufacture. It is to be understood from the outset that the scope of this invention is not limited to these fields or to the specific examples of potential uses presented hereinafter.

2. Description of the Prior Art

The use of semiconductor devices in control circuitry for large electromotive machinery is becoming more and more common. The precision of control and generally light weight and small size of the semiconductor devices are advantages which are difficult to ignore. However, there remains a crucial problem with semiconductor devices which has yet to be overcome and that is their sensitivity to heat. Therefore, certain electromotive devices that are required to operate in high temperature areas are prone to premature failure if they use semiconductor control devices.

A common example of this occurs in automotive alternators which are used to generate electrical power for recharging batteries which supply auxiliary electrical power for the vehicle for such devices as lights, windshield wiper motors, radios, etc. The alternator is located in close proximity to the massive heat source of a high powered internal combustion engine. Conventional alternators naturally generate a cyclic alternating current as they are turned by the engine. A steady direct current is required to recharge the conventional wet cell chemical batteries in common use. A rectifier device is needed to convert the alternating current provided by the alternator to the direct current required by the batteries. One such common and inexpensive rectifier can be constructed from six semiconductor diodes and a suitable capacitor connected in a bridge circuit so as to rectify three phase alternating current produced by an alternator. The prior art has disclosed such devices. However problems continue to exist relative to breakdown of the semiconductor diodes due to the excessive heat in the automotive underhood environment. My invention represents a simple and effective means of overcoming these problems with the prior art.

Searches were conducted at the United States Patent and Trademark Office for related inventions and the prior art discovered is discussed herein. As will be seen, the simplicity and effectiveness of my invention is not rivaled in the prior art.

U.S. Pat. No. 4,606,000, issued to Steele et al. on Aug. 12, 1986, shows a bridge rectifier for a diode-rectified alternating current generator. It is comprised of two metallic heat sinks formed respectively of copper and aluminum that are separated by an electrical insulator. Each heat sink carries a plurality of semiconductor diode chips. The diode chips are electrically connected to electrical connectors that are inserted molded to insulator blocks that are supported by one of the heat sinks. The electrical connectors are adapted to be connected to the phase windings of an alternating current generator. The aluminum heat sink has a finned area which is adapted to be contacted by cooling air when the bridge rectifier is mounted in the generator. The structure of this patent forms the basis upon which the improvement of the present invention is predicated. Therefore, U.S. Pat. No. 4,606,000 is hereby incorporated by reference. By contrast, the device of the instant invention has a thicker finned aluminum heat sink portion so as to present approximately twice the surface area to the air flow and thus effectively double the convective heat transfer. In addition, an undercut circumferential groove has been incorporated into the wall forming the major diameter of the finned aluminum heat sink. This groove is deep enough to intersect the air flow path through the finned aluminum heat sink and provide an additional air flow in the radial direction an provide further improved cooling of the sensitive semiconductor diodes. Also, the additional embodiment of my invention showing separate radial cooling fins in place of multiple apertures through the aluminum heat sink is not shown by Steele et al.

U.S. Pat. No. 4,604,538, issued to Merrill et al. on Aug. 5, 1986, shows an air cooled diode-rectified alternating current generator for use on motor vehicles. The generator has an internal fan located within the slip ring end frame and an external fan located adjacent the outer wall of the drive end frame. The internal fan cooperates with a baffle having a central opening and forces cooling air between air inlet openings and air outlet openings formed on the slip ring end frame. The air that traverses this path cools one end of a stator winding and a bridge rectifier. The external fan causes a flow of air between air inlet openings and air outlet openings formed in the drive end frame and this air contacts an opposite end of the stator winding. The cooling arrangement also provides for a flow of cooling air from the air inlet openings in the slip ring end frame to the air outlet openings in the drive end frame. The patent basically discloses the same dual heat sinks described in the Steele et al. patent above and the instant invention presents the same differences.

U.S. Pat. No. 4,286,186, issued to Hagenlocher et al. on Aug. 25, 1981, shows a vehicular alternator end shield construction. The patent is to facilitate manufacture and provide readily accessible insertion openings for rectifier diodes in automotive alternators. The end covers or end shields are made as sheet metal elements with radially extending arms, leaving space for ventilating openings therebetween, extending from the center of rotation of the alternator, and form with bearing retaining means at the center, for example in the form of a punch or drawn bushing extension extending in an axial direction and at right angles to the major plane of the sheet metal element which, preferably, is also formed with stiffening ribs or beads at the lateral edges thereof. Preferably, the alternator is, in cross section, hexagonal and three arms, extending at 120 degrees with respect to each other, the hexagonal outer end portions, are provided to permit universal fitting of the electrical connections with respect to the rotary position of the alternator shell and thus permit matching of the position of electrical connection to various attachment positions of the shell on a internal combustion engine. By contrast the cover or shell of the instant invention is designed to provide passage of the diode connections through in the radial direction.

U.S. Pat. No. 4,680,495, issued to Chiampas et al. on Jul. 14, 1987, shows a spark protected alternator. It has an external cavity on an end plate of the alternator housing with commutating (slip) rings on an alternator shaft extension and mating metal brushes positioned within the external cavity. The external cavity is effectively sealed from ambient atmosphere surrounding the alternator, to provide protection from sparks generated between the brushes and commutating rings wherein a minimum area of the housing end plate is utilized. Integral extensions of the end plate form side walls of the external cavity that partially radially surround the shaft extension and commutating rings. A brush holder in which the brushes are attached has projections which mate with slots in the side walls to radially close the external cavity, and an end cap (including a gasket) closes an open end of the external cavity, while the end plate effectively closes the other end of the external cavity. The brush holder forms part of the walls that close the external cavity, and this minimizes the size of the external cavity required to seal the commutating rings and brushes from the ambient atmosphere. By contrast, the cover or shell of the instant invention is designed to provide passage of the diode connections through in the radial direction and no particular provision has been made for sealing or spark proofing.

U.S. Pat. No. 5,043,614, issued to Yockey on Aug. 27, 1991, shows an alternator rectifier bridge assembly. An alternator rectifier bridge is incorporated into an alternator housing by inserting half of the diodes of the bridge into apertures formed into an alternator housing end plate which then serves as one output for the alternator and also as a massive heat sink to dissipate heat generated in the diodes. The other half of the diodes of the bridge are inserted into apertures formed in a radiator plate which is embedded into a plastic circuit member together with conductor members which interconnect electrodes of the diodes to stator windings of the alternator and also perform other electrical connections required for efficient manufacture and proper operation of the alternator. The radiator plate serves as the other output for the alternator and also as a heat sink. The plastic circuit member is coupled to the alternator housing end plate such that the electrodes of the diodes embedded therein pass through the plastic circuit member to engage corresponding ones of the conductor members resulting in a compact, highly efficient bridge which is readily assembled, preferably in an automated manner, using a limited number of component parts. A crescent shaped plastic end plate is molded so as to embed several of the electrical components of the rectifier bridge and make the appropriate connections when the plate is fastened to an end wall of the alternator which serves as a heat sink. By contrast, the instant invention has a cover plate which attaches to a separate dual metallic heat sink which does not form an integral part of the alternator. Also, the cooling air ports of the instant invention are provided with side ports, provided by a special undercut groove, which allow air flow in both the longitudinal and radial directions.

U.S. Pat. No. 4,162,419, issued to DeAngelis on Jul. 24, 1979, shows an alternator having improved rectifier cooling. The rectifier assembly of an alternator is provided with improved cooling by improved air flow directed over the semiconductor elements of the rectifier assembly. Improved flow of air is provided by an auxiliary fan blade that is attached to a rotating member in the alternator structure. The fan blade is in proximity to the semiconductor rectifier elements of the rectifier assembly. Air ports are provided in the alternator housing to accommodate this longitudinal air flow and to improve the distribution of cooling air. By contrast, the cooling air ports of the instant invention are provided with side ports, provided by a special undercut groove, which allow air flow in both the longitudinal and radial directions.

U.S. Pat. No. 4,419,597, issued to Shiga et al. on Dec. 6, 1983, shows an alternator assembly having a rectifier device in thermal contact with case and cover. The patent shows; an alternator assembly for an automotive vehicle including a rectifier device composed of a plurality of diodes supported on a negative-side cooling fin of semi-circular shape, a plurality of diodes supported on a positive-side cooling fin of semi-circular arc shape, and a terminal board supporting a plurality of terminals connected to the diodes. The rectifier device is assembled and held in a unitary structure by a plurality of metal members, and arranged in a space defined by an end frame and a rear cover of the alternator assembly in such a manner that the metal members are in contact at one end thereof with the rear cover and at the other end thereof with the end frame. By contrast, the cooling air ports of the instant invention are provided with side ports, provided by a special undercut groove, which allow air flow in both the longitudinal and radial directions.

It will be noted that all the prior art devices provide for air cooling by the flow of air in a single direction regardless of the type of air flow ports or fins, etc. provided. This uni-directional air flow makes these devices inefficient as convective heat transfer devices and thus leads to the aforementioned overheating and semiconductor failures discussed above.

None of the above inventions and patents, taken either singly or in combination, is seen to describe the instant invention as claimed.

SUMMARY OF THE INVENTION

Briefly, the invention comprises an improved cooling fin arrangement for a triphasic bridge rectifier used in conjunction with a three phase alternator in an automotive vehicle. The heat transfer ability of a metallic air core heat sink and radiator is more than doubled by increasing its thickness (and thus its exposed surface area) and by providing a cutout groove allowing the air to flow in two directions thus reducing the air flow resistance. An improved cover plate cooperates with the newly provided air flow paths and also provides simplified connectors for the electrical elements.

Accordingly, it is a principal object of the invention to provide a new and improved cooling structure for a triphasic alternator rectifier which overcomes the disadvantages of the prior art in a simple but effective manner.

It is a major object of this invention to provide a new and improved cooling structure for a triphasic alternator rectifier which is easily adapted to be provided as a kit for mounting to a presently mass produced alternator as an improvement thereof.

It is another object of the invention to provide such a new and improved cooling structure for a triphasic alternator rectifier which is at least twice as effective in removing heat from the area of the sensitive semiconductor diodes as anything disclosed by the prior art.

It is another object of the invention to provide such a new and improved cooling structure for a triphasic alternator rectifier which-achieves its advantages by extending the dimension of a radiator device in the direction of air flow so as to present more convective surface area to the flow of air past the device.

It is another object of the invention to provide such a new and improved cooling structure for a triphasic alternator rectifier which achieves its advantages by the provision of an undercut groove which allows additional air flow and wherein the additional air flow is diverted directly across some of the semiconductor diodes of the rectifier.

It is another object of the invention to provide such a new and improved cooling structure for a triphasic alternator rectifier with cooling fins in place of the conventional cooling ports so as to enhance the radiant heat transfer in addition to the convective heat transfer of the device.

It is another object of the invention to provide such a new and improved cooling structure for a triphasic alternator rectifier with an improved cover arrangement which provides both protection from the elements as well as integral provision of some of the required electrical connection elements between diodes.

Finally, it is a general goal of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

The present invention meets or exceeds all the above objects and goals. Upon further study of the specification and appended claims, further objects and advantages of this invention will become apparent to those skilled in the art.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

Figures 1, 2:
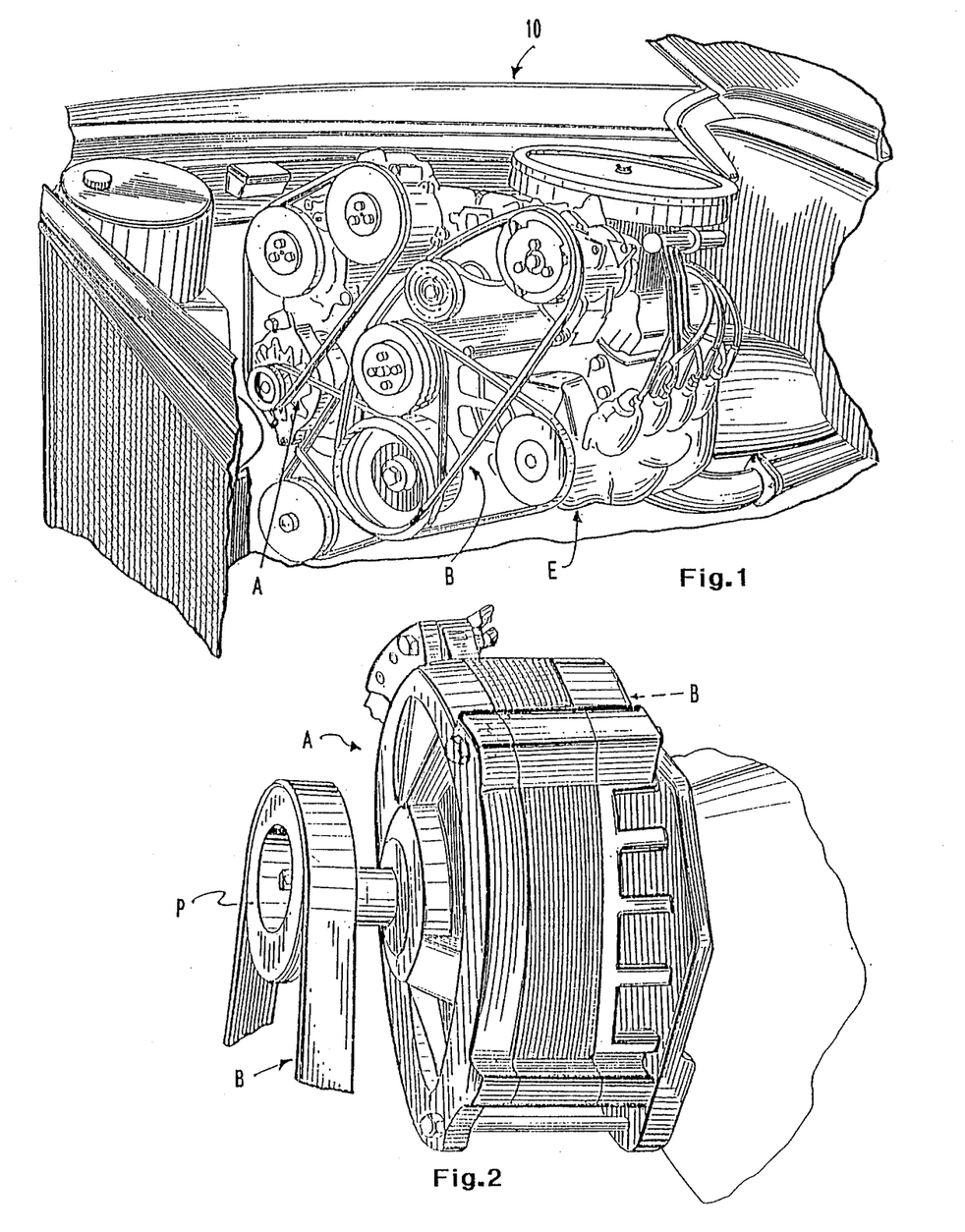
FIG. 1 is an environmental perspective view of an automotive engine with an alternator which uses the invention.
FIG. 2 is perspective view of an automotive alternator with the general location of the triphasic rectifier bridge identified.

FIG. 1 illustrates generally at 10 the overall environment in which the invention is likely to be used. High powered internal combustion engine E of a standard automotive vehicle is illustrated with alternator A near the front thereof driven by belt drive B. It is obvious that the alternator A is located in a high heat location since at least 60% of the fuel energy burned by an internal combustion engine is wasted as heat. The high temperatures caused by the heat of the engine in the confined quarters of the engine compartment are cause for considerable concern when semiconductor electronic control elements are used in this area.

FIG. 2 illustrates a closer view of alternator A and the relative location of the triphasic rectifier bridge B of which this invention forms an improvement. Belt drive B provides rotary energy through pulley P to alternator A. Rectifier bridge B is generally arcuate in shape and is mounted near the rear (with respect to the vehicle) plate of alternator A.

Figure 3:
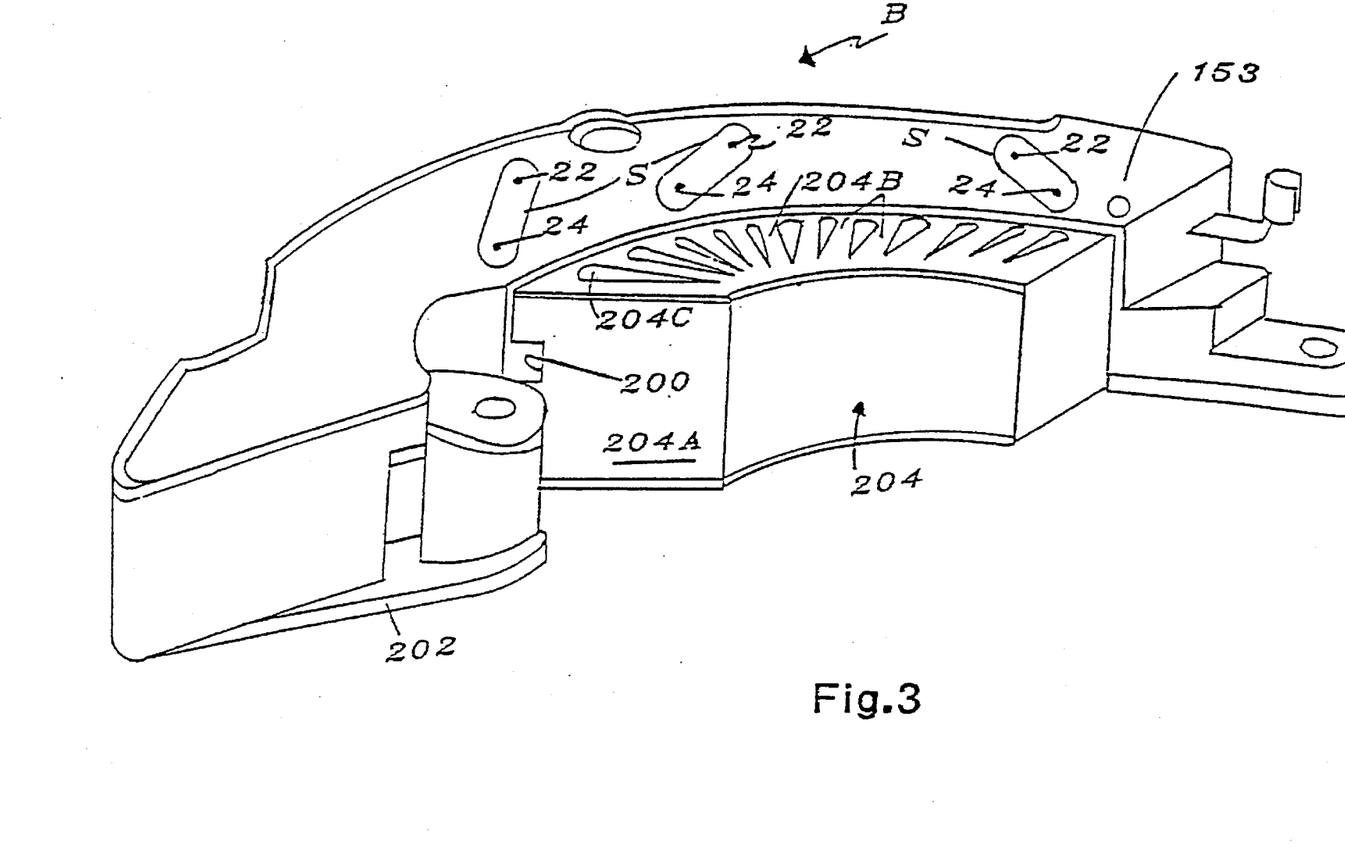
FIG. 3 is a perspective view of the triphasic rectifier of the invention with the cover in place and showing the aluminum heat sink radiator portion with the edge of the undercut groove being visible.

FIG. 3 shows the rectifier bridge assembly B as it appears when removed from alternator A. Cover portion 153 is made of plastic material for protection of the internal components of the rectifier from the elements. Seen on the outer portion of the cover 153 are three are three slots S (see also FIG. 4). The slots S each contain and embedded conductor to connect outer and inner wires 22 and 24 which each lead to an appropriate side of an internal diode. The diodes are thus connected together in pairs. The cover 153 used is not the same as cover 53 in the Steele et al. Patent, incorporated by reference, but is a commercially available replacement cover which is manufactured by Transpo Electronics Incorporated. The general layout of the rectifier bridge is well documented in U.S. Pat. No. 4,606,000 which is incorporated by reference. In general the positioning of the diodes and other electronic components is identical in my invention as described in Steele et al. Three diodes D are mounted on the copper heat sink plate 202 and three are mounted on the aluminum heat sink plate 204. The diodes are connected to the phase windings of the alternating current generator as shown in the circuit diagram of FIG. 13 of the Steele Patent. Note in particular that the diodes are connected together in pairs. These pair connections are made in the cover 153 of this invention, described earlier.

Figure 7:
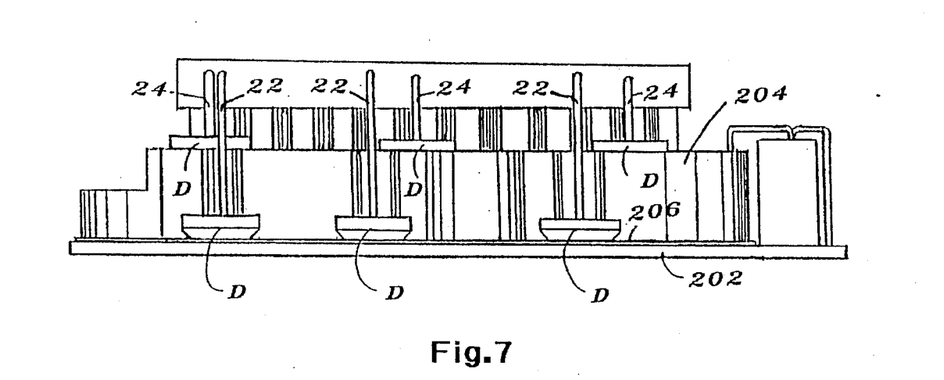
FIG. 7 is a side view of the triphasic rectifier shown in FIG. 4 showing the semiconductor diode positions and the edge of the undercut groove in the aluminum heat sink radiator.
Figure 8:
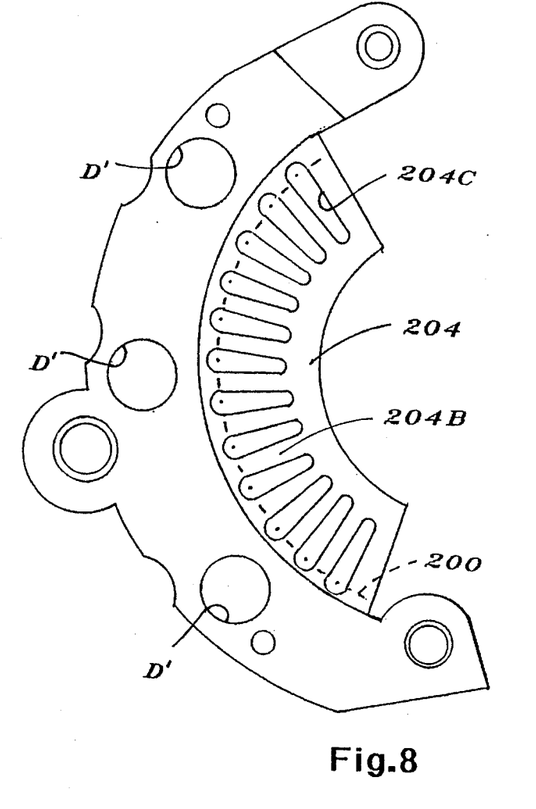
FIG. 8 is a top view of the aluminum heat sink radiator showing the tapered air passageways and the general arcuate shape of the heat sink radiator.
Figure 9:
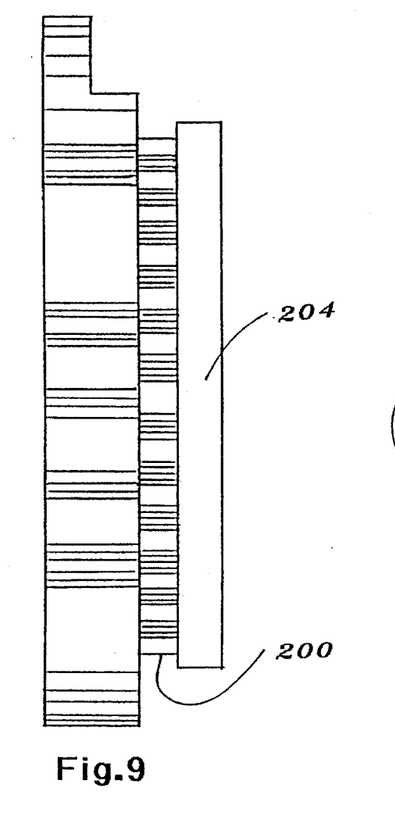
FIG. 9 is a side view of the radiator of FIG. 6 showing the openings formed by the intersection of the undercut groove on the major diameter of the radiator portion with the tapered slots shown in FIG. 8.

Particular attention is drawn to FIGS. 9–13 of that Patent in which the dual heat sink concept is illustrated. The instant invention also incorporates the dual heat sink concept with copper heat sink 202 and aluminum heat sink 204 visible in FIG. 3. The copper heat sink 202 is electrically insulated from the aluminum heat sink 204 by a thin interposed membrane 206 best visible in FIG. 7 and well described in the incorporated Patent.

Aluminum heat sink 204 is similar but not identical to the heat sink described in the Steele et al. Patent incorporated herein. A major difference and improvement of this patent is that arcuate portion 204A including radially extending passages 204C separated by fins 204B are twice as thick (in the longitudinal direction of the passages) as the corresponding portions 104A, 104B, and 104C of the prior art patent. The thicker arcuate radiator portion of the aluminum heat sink presents approximately twice the surface area for convective heat transfer to the cooling air.

Figure 4:
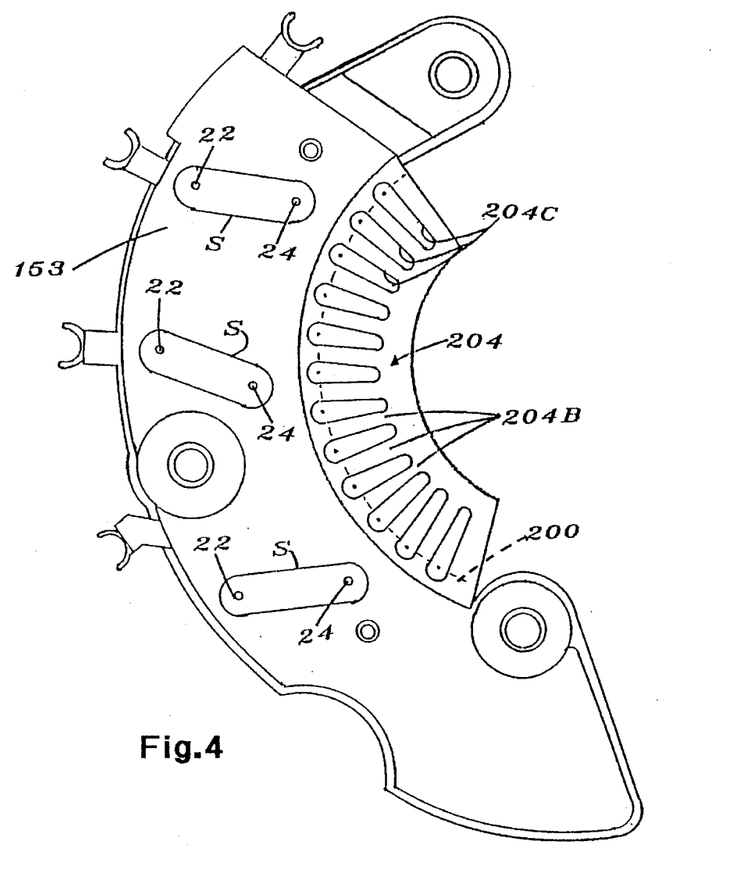
FIG. 4 is a top view of the triphasic rectifier with the cover in place and showing the integral diode connector portions with the external connectors visible as extending beneath the cover on the left and top side of the figure.
Figure 5:
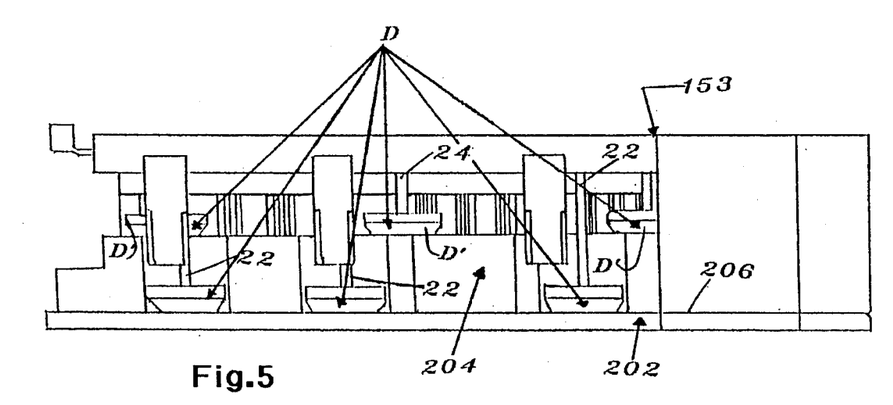
FIG. 5 is a side view of the triphasic rectifier shown in FIG. 4 with the cover in place showing the semiconductor diode positions and the underlying copper heat sink.
Figure 6:
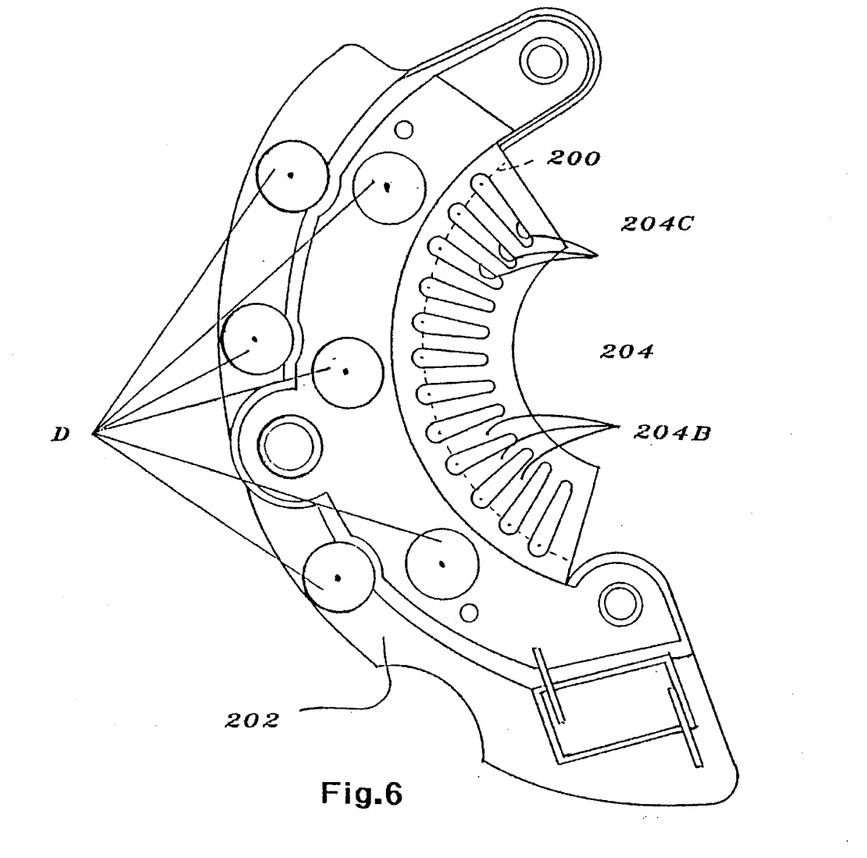
FIG. 6 is a top view of the triphasic rectifier with the cover removed to expose the copper and aluminum heat sink radiators and the semiconductor diode positions.
Figure 10:
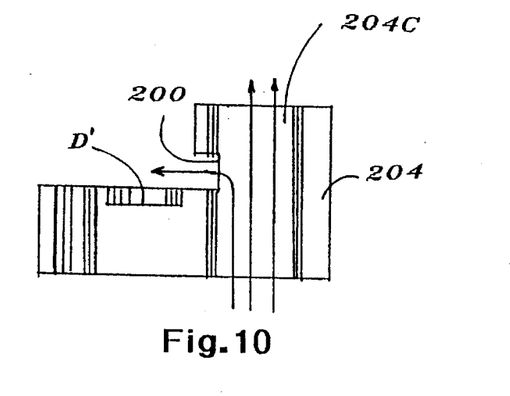
FIG. 10 is a radial cross section through the aluminum heat sink of invention clearly showing the intersection of the undercut groove and one of the tapered air passageways and the air flow produced by this invention.

Another major difference is the undercut groove 200 which extends all the way around the larger diameter portion of the arcuate portion 204A of the aluminum heat sink at a position approximately half way along the longitudinal thickness. The depth of the groove 200 is such that its back face intersects the outer radial tip of each of the radially extending air passages 204C. The edge of rectangular groove 200 may clearly be seen in FIG. 3. In FIG. 4 the depth of rectangular grove 200 may be seen in the hidden line arc as being just sufficient to open into the outer end of each of the radially extending air passages 204C. Air is forced through the air passages 204C in the manner well described in the Steele et al. Patent, incorporated by reference. The effect of undercut groove is to give the air in passages 204C another exit path into the undercut groove 200. FIG. 10 clearly illustrates with arrows the newly provided pathway for the air. This additional exit path reduces the flow resistance of the air passageways and will lead to increased flow volume for the same pressure differential. As is well known to those skilled in the art, the increased flow volume will significantly increase the convective heat transfer of the "radiator". Thus the improved aluminum heat sink 204A of the instant invention is much better at providing cooling for the semiconductor diodes than is the incorporated prior art version.

In FIG. 10 it also can be seen that diode support cup D' is directly in line with the diverted air flow passing into groove 200. This means that the diodes supported in cup D' are also subjected to direct convective cooling from the air flow as well as the conductive cooling afforded by the aluminum heat sink 204A. This direct convective cooling of the diodes mounted on the aluminum heat sink is not shown or made possible by the prior art.

Figure 11:
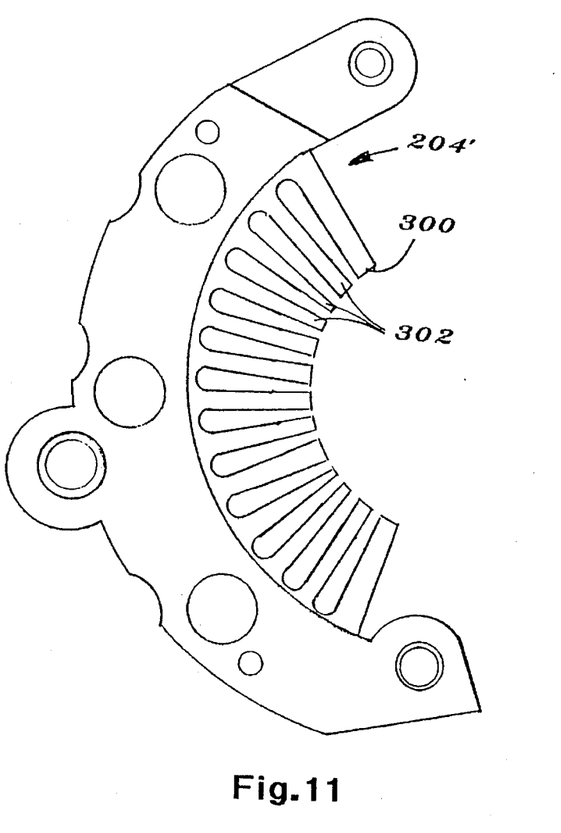
FIG. 11 is a top view, similar to FIG. 8, but showing an alternate embodiment of the invention where the tapered air passageways have been extended all the way to the minor diameter of the circular sector so as to form slots and fingers or radial fins.
Figure 12:
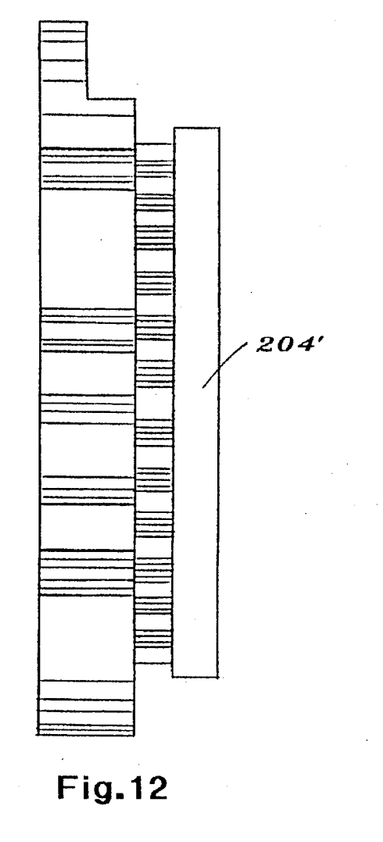
FIG. 12 is a side view, similar to FIG. 9, of the alternate radial fin embodiment of the invention.
Figure 13:
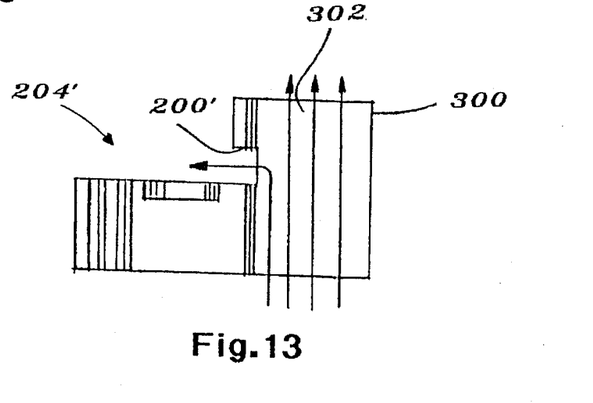
FIG. 13 is a cross section view, similar to FIG. 10, of the alternate radial fin embodiment of the invention.
Figure 14:
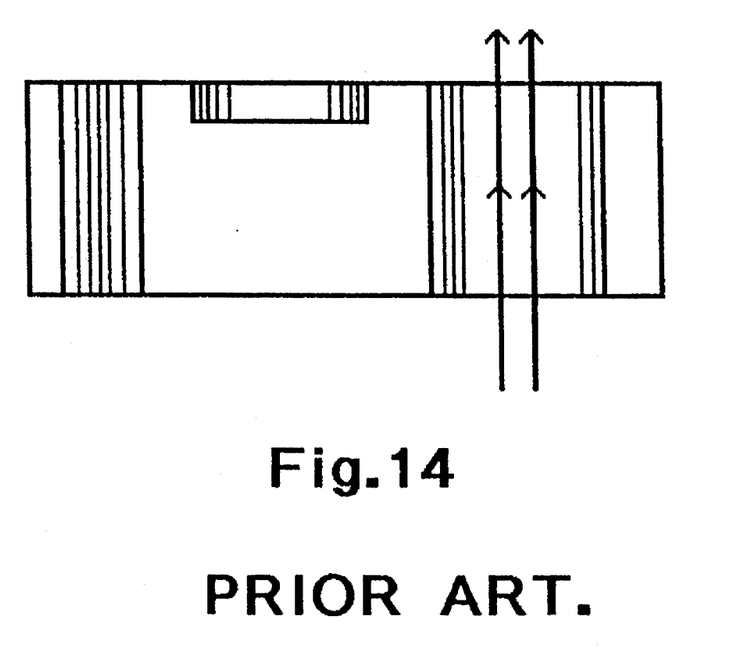
FIG. 14 is a cross sectional view of a prior art aluminum heat sink illustrating the straight line air flow.

A variant of the improved aluminum heat sink is shown as 204' in FIGS. 11–13. In this embodiment the air passageways 204C of the prior embodiment have been extended inwardly in the radial direction until they actually break the inner radial surface 300 of arcuate aluminum heat sink 204. Thus formed are full fins or fingers 302 which provide excellent radiant heat transfer capabilities as well as the previously described convective and conductive advantages. Inner groove 200' is undercut in the same manner as in the previous embodiment.

It is to be understood that the provided illustrative examples are by no means exhaustive of the many possible uses for my invention.

From the foregoing description, one skilled in the art can easily ascertain the essential characteristics of this invention and, without departing from the spirit and scope thereof, can make various changes and modifications of the invention to adapt it to various usages and conditions. For example, the artisan could easily ascertain that the undercut groove need not be rectangular in cross section but could be circular or any other convenient shape.

It is to be understood that the present invention is not limited to the sole embodiment described above, but encompasses any and all embodiments within the scope of the following claims:

I claim:

1. An improved bridge rectifier for a rotary electromotive machine having a main rotary axis comprising;

a first metallic heat sink that is adapted to engage an end frame of the electromotive machine when the bridge rectifier is mounted to the electromotive machine;

a second metallic heat sink;

an electrical insulator sandwiched between said heat sinks for electrically insulating said heat sinks from each another;

a first group of semiconductor diode chips supported by said first heat sink such that they are electrically connected to and in heat transfer relationship with said first heat sink;

a second group of semiconductor diode chips supported by said second heat sink such that they are electrically connected to and in heat transfer relationship with said second heat sink; wherein the improvement comprises:

said second heat sink being formed with an arcuate portion having substantial length in a direction parallel to said main rotary axis and partially surrounding said main rotary axis of said electromotive machine and including multiple radial air passageways for the passage of cooling air in a direction parallel to said main rotary axis;

said second heat sink further including an undercut circumferential groove around an inner diameter of said arcuate portion substantially midway along said length thereof;

said groove having a depth sufficient to intersect an inner radial end of said air passageways to allow for and direct the additional passage of cooling air into said groove and in an inward radial direction thus substantially increasing the air flow through and thus the cooling effect of said second heat sink.

2. The improved bridge rectifier of claim 1, wherein; said semiconductor diode chips supported by said second heat sink are mounted in the path of the additional cooling air directed in said inward radial direction thus providing additional direct convective cooling to said diode chips.

3. The improved bridge rectifier of claim 1, wherein; said groove is substantially rectangular in cross section.

4. The improved bridge rectifier of claim 3, wherein; said groove is substantially rectangular in cross section.

5. The improved bridge rectifier of claim 1, wherein; said multiple radial air passageways for the passage of cooling air in a direction parallel to said main rotary axis are closed around their circumference thus forming multiple tube like passageways.

6. The improved bridge rectifier of claim 1, wherein; said multiple radial air passageways for the passage of cooling air in a direction parallel to said main rotary axis are open at their radial outward ends thus forming multiple passageways between radial fin projections around said arcuate portion.

7. A polyphase bridge rectifier for an automotive alternator having a main rotary axis comprising;

a group of semiconductor diode chips supported by said heat sink such that they are in heat transfer relationship with said heat sink; wherein the improvement comprises:

said heat sink being formed with an arcuate portion having substantial length in a direction parallel to said main rotary axis and partially surrounding said main rotary axis of said electromotive machine and including multiple radial air passageways for the passage of cooling air in a direction parallel to said main rotary axis;

said heat sink further including an undercut circumferential groove around an inner diameter of said arcuate portion substantially midway along said length thereof;

said groove having a depth sufficient to intersect an inner radial end of said air passageways to allow for and direct the additional passage of cooling air into said groove and in an inward radial direction thus substantially increasing the air flow through and thus the cooling effect of said heat sink.

8. The improved bridge rectifier of claim 7, wherein; said semiconductor diode chips supported by said heat sink are mounted in the path of the additional cooling air directed in said inward radial direction thus providing additional direct convective cooling to said diode chips.

9. The improved bridge rectifier of claim 7, wherein; said multiple radial air passageways for the passage of cooling air in a direction parallel to said main rotary axis are closed around their circumference thus forming multiple tube like passageways.

10. The improved bridge rectifier of claim 7, wherein; said multiple radial air passageways for the passage of cooling air in a direction parallel to said main rotary axis are open at their radial outward ends thus forming multiple passageways between radial fin projections around said arcuate portion.

11. The improved bridge rectifier of claim 10, wherein; the heat sink is vertically higher on the rotary axis.

* * * * *